United States Patent [19]

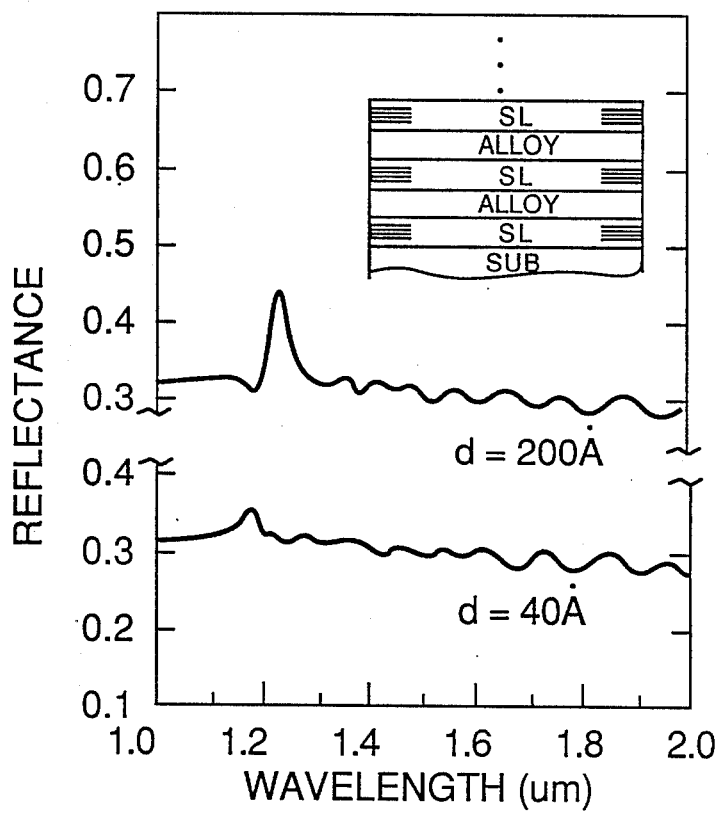
Fig. 1
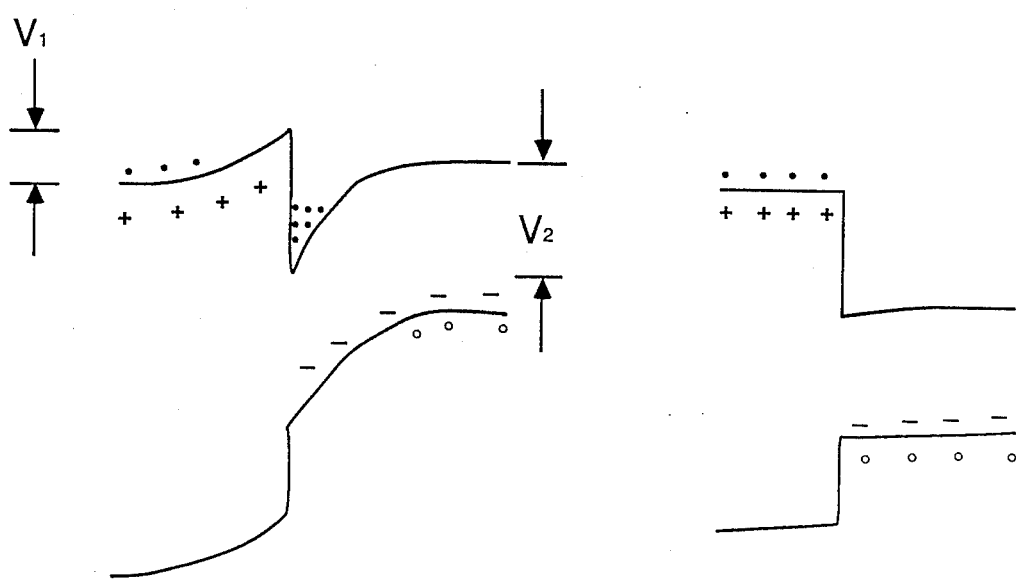
Fig 2(a) Vext = 0
Fig 2(b) Vext = V₁ = V₂

Biefeld et al.

[11] Patent Number: 4,947,223

[45] Date of Patent: Aug. 7, 1990

[54] SEMICONDUCTOR DEVICES INCORPORATING MULTILAYER INTERFERENCE REGIONS

[75] Inventors: Robert M. Biefeld, Albuquerque; Timothy J. Drummond, Tijeras; Paul L. Gourley; Thomas E. Zipperian, both of Albuquerque, all of N. Mex.

[73] Assignee: The United States of America as represented by the United States Department of Energy, Washington, D.C.

[21] Appl. No.: 91,560

[22] Filed: Aug. 31, 1987

[51] Int. Cl.$^5$ .................... H01L 27/14; H01L 31/00
[52] U.S. Cl. ............................ 357/30; 357/4; 357/16; 350/355
[58] Field of Search ............... 357/45 L, 30 E, 30 L, 357/30 B, 30 Q, 16; 350/355, 356, 163, 164, 166, 1.6; 372/45, 49

[56] References Cited

U.S. PATENT DOCUMENTS

| | | | |
|---|---|---|---|
| 3,626,257 | 12/1971 | Esaki et al. | 357/16 |
| 3,758,797 | 11/1973 | Peterson et al. | 307/324 |
| 3,813,605 | 5/1974 | Szoke | 350/160 X |
| 3,893,148 | 7/1975 | Madjid | 357/16 |
| 4,092,659 | 5/1978 | Ettenberg | 357/17 X |
| 4,205,331 | 5/1980 | Esaki et al. | 357/30 |
| 4,270,094 | 5/1981 | Holonyak, Jr. | 357/16 X |
| 4,309,670 | 1/1982 | Burnham et al. | 357/17 X |
| 4,317,086 | 2/1982 | Scifres et al. | 372/49 |
| 4,438,446 | 3/1984 | Tsang | 357/17 |
| 4,439,782 | 3/1984 | Holonyak, Jr. | 357/17 |
| 4,477,824 | 10/1984 | Dutt | 357/17 |
| 4,510,607 | 4/1985 | Garcia et al. | 372/49 |
| 4,525,687 | 6/1985 | Chemla et al. | 357/16 X |
| 4,546,244 | 10/1985 | Miller | 372/45 X |
| 4,591,889 | 5/1986 | Gossard et al. | 357/4 |
| 4,705,361 | 10/1987 | Frazier et al. | 357/16 X |
| 4,716,449 | 12/1987 | Miller | 357/4 X |
| 4,790,635 | 12/1988 | Apsley | 350/356 |

OTHER PUBLICATIONS

Fowles, G. R., *Introduction to Modern Optics*, Holt, 1975, pp. 96–102.
Gourley, "Single Crystal Semiconductor Multilayers . . . " Superlattices and Microstructures, vol. 1, No. 3, 1985, pp. 227–230.
Ogura et al., "GaAs/AlGaAs Multilayer Reflector . . . " Japanese Jour. of Applied Physics, vol. 22, No. 2, 1983, pp. L112–L114.
Gourley et al., "Single Crystal Optical Interference Filters . . . " Appl. Phys. Lett. 49(5), Aug. 4, 1986, pp. 242–244.
Gibbs et al., "Optical Bistability in Semiconductors" Appl. Phys. Lett. 35(6) Sep. 15, 1979, pp. 451–453.
Gourley et al. "Single Crystal Epitaxial Multilayers . . . " Appl. Phys. Lett. 49(9), Sep. 1, 1986, pp. 489–491.
Gibbs et al., "Room-Temperature Exitonic Optical Bistability . . . " Appl. Phys. Lett., 41(3), Aug. 1, 1982, pp. 221–222.
Chemla et al., "Electroabsorption by Stark Effect . . . " Appl. Phys. Lett. 42(10), May 15, 1983, pp. 864–866.

*Primary Examiner*—Andrew J. James
*Assistant Examiner*—Sara W. Crane
*Attorney, Agent, or Firm*—George H. Libman; James H. Chafin; William R. Moser

[57] ABSTRACT

A semiconductor high reflector comprising a number of thin alternating layers of semiconductor materials is electrically tunable and may be used as a temperature insensitive semiconductor laser in a Fabry-Perot configuration.

7 Claims, 4 Drawing Sheets

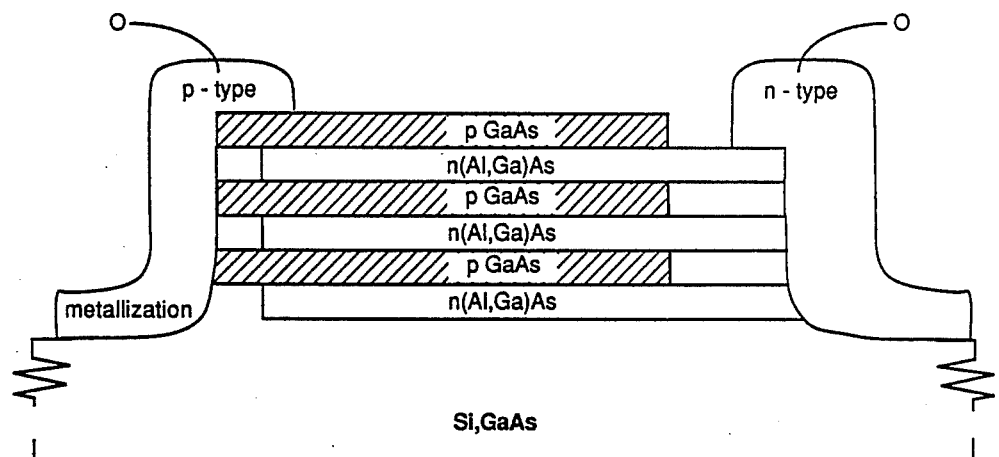

SEMICONDUCTOR DEVICES INCORPORATING MULTILAYER INTERFERENCE REGIONS

The U.S. Government has rights in this invention pursuant to Contract Number DE-AC04-76DP00789 between the U.S. Department of Energy and AT&T Technologies, Inc.

BACKGROUND OF THE INVENTION

This invention relates to certain new semiconductor devices which incorporate multilayer optical interference regions, e.g., quarter-wave high reflector stacks (HR).

A wide variety of semiconductor devices depend upon appropriate reflectance/transmittance properties of certain regions therein. These include lasers, bistable optical devices, optical modulators, photodetectors, etc. Conventionally, reflectance and transmittance are achieved by the use of dielectric and metallic surfaces. Typically, these surfaces are incorporated into the device by mechanical or even chemical means, typically to form a nonmonolithic structure. See, e.g., Gibbs et al, Appl. Phys. Lett. 41 (3), 1 Aug. 1982, 221; Chemla et al, Appl. Phys. Lett. 42 (10), 15 May 1983, 864; U.S. Pat. No. 3,813,605; U.S. Pat. No. 3,758,797; U.S. Pat. No. 3,626,257; U.S. Pat. No. 4,477,824; with respect to bistable devices, and a wide variety of references with respect to other such optical devices including lasers, e.g., as described in U.S. Pat. Nos. 4,591,889; 4,438,446; 3,893,148; 4,205,331; 4,439,782; 4,270,094.

The use of multilayers of semiconductor materials to achieve the desired reflectance/transmittance has also been disclosed. Such layers have been incorporated into optical devices monolithically. The layers include both lattice matched semiconductor binaries or alloys, and lattice mismatched (strained) semiconductor binaries or alloys (SLS). Furthermore, individual layers of the multilayers may comprise superlattices (matched or mismatched) of very thin layers wherein quantum size effects are present. See, e.g., Gourley, "Superlattices and Microstructures", Vol. 1, No. 3, 1985, 227; Ogura et al, Japanese Journal of Applied Physics, Vol. 22, No. 2, February 1983, L112 (the use of top and bottom multilayer HRs surrounding an active GaAs region to form a surface-emitting laser diode); U.S. Pat. No. 4,309,670 (discussing such multilayer regions at one or both ends of a Fabry-Perot cavity), as well as discussions of this invention which appear in the literature, e.g., Gourley et al, Appl. Phys. Lett. 49 (9), 1 Sept. 1986, 489. See also Gourley et al, Appl. Phys. Lett. 49 (5), 4 Aug. 1986, 242 for a discussion of the use of such multilayer HR stacks as optical interference filters, e.g., for use in conjunction with a photodiode. Multilayer HR regions based on mismatched materials are discussed by Gourley et al (4 Aug. 1986).

SUMMARY OF THE INVENTION

It is an object of this invention to provide semiconductor devices having novel structures and/or surprisingly advantageous properties and which incorporate multilayer optical interference regions, e.g., HR regions.

It is another object of this invention to provide an improved Fabry-Perot device incorporating HRs.

It is still another object of this invention to provide an electrically tunable HR.

Upon further study of the specification and appended claims, further objects and advantages of this invention will become apparent to those skilled in the art.

In one aspect, these objects have been achieved by providing a semiconductor device comprising a monolithically-incorporated multilayer optical interference region comprising a series of alternating n- and p-layers having indices of refraction which differ from each other, all n-layers in the interference region being in direct physical and electrically conductive contact with a first electrical contact which is not in electrically conductive contact with the p-layers, and all p-layers being in direct physical and electrically conductive contact with a second electrical contact which is not in electrically conductive contact with the n-layers.

Such a configuration enables the application of an electric potential across the multilayer region whereby the optical properties of the region overall can be varied by variations of the electrical field.

The invention also comprises a Fabry-Perot resonator including two high reflector stacks of quarter-wave thick alternating layers of materials of different indices of refraction separated by a multiple quantum well spacer layer.

This structure will be particularly advantageous where a device is operated as a bistable optical device, surface-emitting laser, or optical modulator (either reflective or transmissive). As a laser, the device is very insensitive to heat compared with prior art semiconductor lasers.

BRIEF DESCRIPTION OF THE DRAWINGS

Various other objects, features and attendant advantages of the present invention will be more fully appreciated when considered in conjunction with the accompanying drawings, in which like reference characters designate the same or similar parts throughout the several views, and wherein:

FIG. 1 shows the reflectance spectra of 2 HRs formed with alternating layers of superlattice and matching alloy;

FIGS. 2A and 2B illustrate the effect on the energy bands of an anisotype heterojunction multilayer region of a change in externally applied electric field;

DETAILED DISCUSSION

Figure 3:
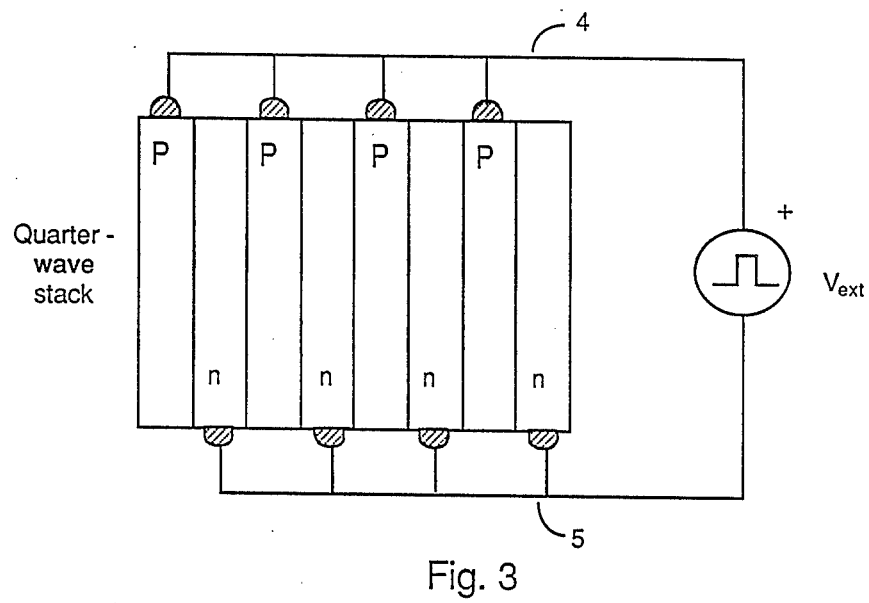
FIG. 3 shows the configuration of an electrically tunable multilayer optical interference region which can be monolithically employed in a like variety of semiconductor devices.

As stated above, the formation of multilayer optical interference stacks is known for both lattice-matched and lattice-mismatched materials. Both systems permit tailorable reflection properties and can be monolithically incorporated into semiconductor devices. The strained-layer superlattices (SLS) have the additional advantage of having tailorable bandgap, lattice constant and other overall properties as is well known. See, e.g., Biefeld et al, Appl. Phys. Lett. 43, 759 (1983); Gourley et al, J. Vac. Sci. Technol. B1. 383 (1983); Osbourn, J. Vac. Sci. Technol. B1, 379 (1983); Osbourn, Phys. Rev. B27. 5126 (1983), Osbourn et al, *Semiconductors and Semimetals,* ed. Willardson et al, Academic Press, N.Y., and many others. In most of the applications discussed herein, the thickness of the layers in SLS's used as interference stacks will be too large to permit the achievement of quantum effects which determine the adjustability of the mentioned electronic properties. However, an individual HR layer may be a superlattice of very thin layers in which quantum-size effects are present, for example, FIGS. 1 and 4.

From the theory of optical interference filters (e.g., Dobrowolski, *Handbook of Optics.* ed. W. G. Driscoll, McGraw-Hill, N.Y., 1978, Ch. 8), the spectral position $\lambda_o$ of the reflectance maximum of a stack of layers is determined by the condition $$\lambda_o = 2(n_H d_H + n_L d_L) \quad (1)$$

where L designates a low index material (e.g., GaP) and H a high index material (e.g., GaAs$_{0.2}$P$_{0.8}$), n is the refractive index and d is the layer thickness. The value of maximum reflectance for these multilayers can be approximated by $$R_{max} \approx \left( \frac{1 - n^*}{1 + n^*} \right)^2 \quad (2)$$

where $$n^* = \left( \frac{n_H}{n_L} \right)^{2N} \times \frac{n_H^2}{n_s} \quad (3)$$

is an effective index of refraction of the multilayer near $\lambda_o$, N is the number of superlattice periods, and $n_s$ is the index of the substrate. The width of the high reflectance zone can be approximated by $$\frac{\Delta \lambda}{\lambda_o} = \frac{4(n_H - n_L)}{\pi(n_H + n_L)} \quad (4)$$

Equations (1), (2) and (4) give close agreement with experimental measurements, e.g., as described fully in Gourley et al, Appl. Phys. Lett. 49 (5), 4 Aug. 1986, 242, which is fully incorporated by reference herein as part of this specification. See, e.g., its figures.

The insert of FIG. 1 shows an example of a HR according to this invention where the high index layers are a superlattice composed of alternating layers of GaAs and AlAs, and the low index layers are an alloy of Al$_{0.4}$Ga$_{0.6}$As. In the HR of the upper curve, the layer thicknesses were 120 and 80 Angstroms, respectively. For the lower curve, the layer thicknesses were 24 and 16 Angstroms. For both curves, superlattice thickness ($d_H$) was approximately equal to alloy thicknes ($d_L$), 900 Angstroms. The experiment showed that the superlattice index is higher than the alloy index, and that the superlattice index increases with layer thickness.

Of course, it is possible not only to maximize the reflectance, but also to minimize the reflectance at the selected wavelength. In such a situation, the low index material is uppermost. Achievable values of $R_{max}$ range from near 0 to 1.0 by increasing the total number N of layer periods and/or using larger compositional differences between layers, etc.

For lattice mismatched multilayers, including SLS's, a special advantage is greater variability in the compositions of the layers. Thus, the bandgap of the reflective layer region can be compositionally selected to meet the requirements of the particular device, e.g., to avoid absorption of the operational wavelengths of light, leaving layer thicknesses as an adjustable parameter to match the reflectance interference wavelength to the necessary value. Of course, any of the multilayer regions per this invention can be utilized in conjunction with a wide variety of active regions from single layers to multilayers, including both lattice-matched superlattices and strained-layer superlattices involving mismatched materials. These multilayer reflectance regions can be positioned essentially anywhere, e.g., within the semiconductor device, to form an interface between two other semiconductor regions or at the very top or very bottom of the device to form an interface with air. Of course, they can also be used to form an interface with metals or insulators, internal or external.

An advantage of the HR device of this invention is that it may be electrically tuned to provide for electrical control of its optical properties. There exist several schemes to electrically tune the HR device, such as modulation of charge density near the interfaces (modify real part of index) or electro-absorption (Stark shift, modify imaginary part of index). Most of these schemes utilize the application of an electrostatic potential perpendicular to the layers. Since the layers are composed of well-behaved semiconductor materials, they can be doped n- or p-type. There are several possible doping configurations depending on the energy gap lineup (i.e., type I or type II superlattice) and the heterojunction type (i.e., anisotype or isotype).

In one scheme, the object is to find a particular heterojunction case in which the refractive index discontinuity across the junction can be enhanced by free carrier effects. If the change in index due to the free carriers varies with density over parallel mass, it is most favorable to have small parallel mass and large carrier density. The carrier density near the interface can be substantially increased by the band offsets and band bending. By applying a potential across the junction, the interface density can be changed. The result is that the net reflectance and/or peak wavelength for the multilayer is changed.

FIGS. 2A and 2B show an energy band diagram for an anisotype heterojunction multilayer for the near-junction region when no external bias is present (FIG. 2A), and when bias is present (FIG. 2B). In FIG. 2A, there has been a transfer of electrons (solid dots) from material 1 (left-hand side) to material 2 (right-hand side). This charge transfer results in band bending by amounts $V_1$ and $V_2$, respectively. The bending can be rather large if the layers are heavily doped and thick, which is quite compatible with quarter-wave stacks. As a result of this bending, a V-shaped potential well is formed near the junction in material 2. This well effectively traps a large number of electrons, the large concentration of electrons altering the near-junction refractive index of material 2 and consequently the interface reflectance.

FIG. 2B shows that an external bias lowers the bending until the bands are nearly flat. Under this condition, the potential well is eliminated. Holes injected from side 2 recombine with electrons at the interface, leaving a minimal electron concentration. As a result, the near-junction index of side 2 and the interface reflectance is perturbed slightly.

Although the perturbation of one interface reflectance is small, the effect is amplified by periodic placement of a large number of such junctions as shown in FIG. 3, where a quarter-wave HR is seen to consist of a series of alternating n-layers (material 1) and p-layers (material 2) having different indices of refraction. All the n-layers are in direct physical and electrically conductive contact with a first electrical contact 5 that is not in electrically conductive contact with the p-layers. All the p-layers are in direct physical and electrically conductive contact with a second electrical contact 4 that is not in electrically conductive contact with the n-layers.

Figure 4:
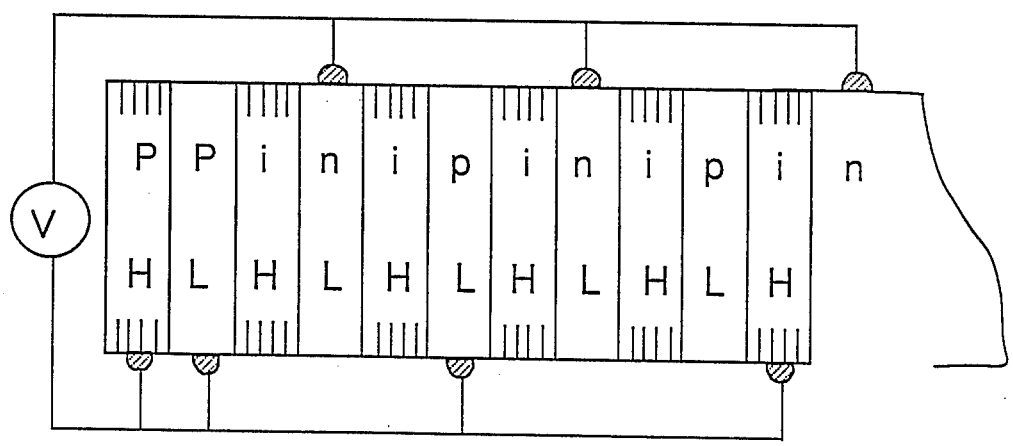
FIG. 4 shows an alternate configuration employing MQW layers.

An alternate tuning arrangement is shown in FIG. 4 where an electric field is set up in a MQW to alter the absorption and refractive index near the exciton wavelength by the quantum confined Stark effect. The MQW has thin layers (~100 Angstrom) of GaAs and AlGaAs. Since the MQW is part of a reflectance structure, it differs significantly from the structure shown in Chemla et al, Appl. Phys. Lett. 42, 10 May 1983.

The electrical tuning arrangement of this invention can be employed in any device incorporating a multilayer optical interference region. The details of electrical tuning in each case can be routinely determined with a few orientation experiments. In each application, the effect of the electrical tuning would normally be to change the optical properties of the HR, thereby changing to output of the switch, laser, or modulator in which the tuned HR has been incorporated.

Figure 5:
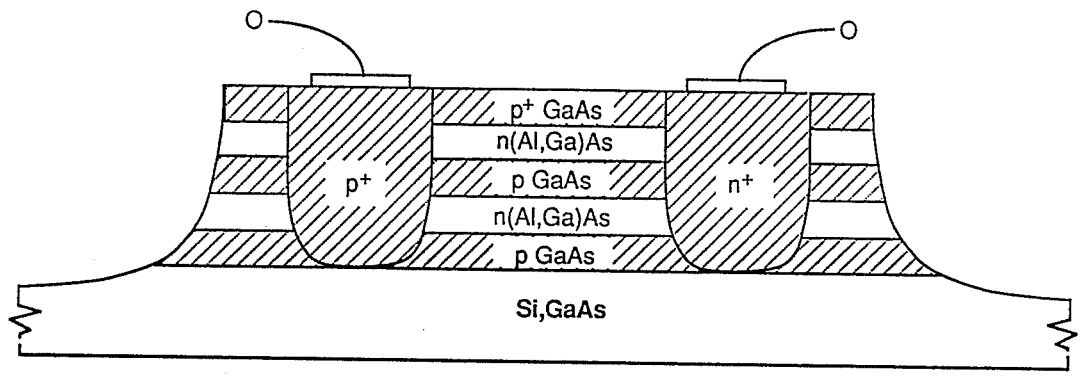
FIGS. 5 and 6 show two methods for selectively contacting n- and p-layers in an electrically controllable optical interference region of this invention.

The individual contacts to the individual layers can be fabricated in several ways in accordance with this invention. FIG. 5 illustrates one technique wherein alternate p- or n-type layers in a p-n-p-n heterostructure stack are separately contacted. The p+ and n+ regions are selective, localized, ion implants which penetrate all the way through the stack. In this way, all of the n-layers are shorted by the n+ implant and all of the p-layers are shorted by the other. The common n layers are electrically isolated from the common p layers by operating the device in a reverse bias condition. Typically, the concentration of carriers in the implant regions will be about $5 \times 10^{17}$ or more. Fully conventional ion implantation methods, e.g., as disclosed in D. R. Myers et al., J. Appl. Phys. 60 3641, Nov. 15, 1986, can be used to achieve the necessary implant regions. In addition, fully conventional techniques are used to electrically contact all of the p- and all of the n-type layers on the surface of the sample.

Figure 6:
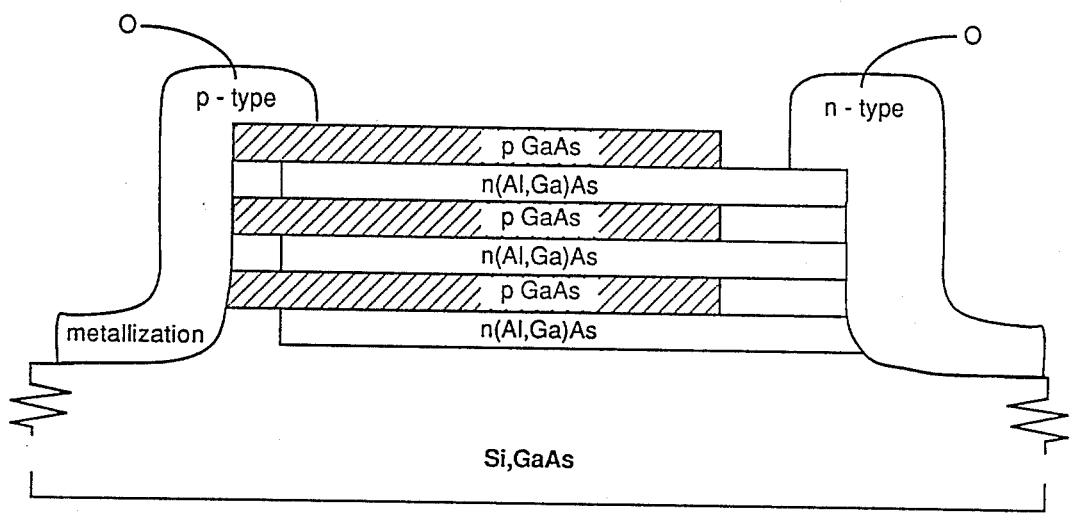

FIG. 6 illustrates an alternative method for performing the contacting of the alternating p and n layers. Using fully conventional technology per se, gaseous or wet chemical etchants are used to selectively attack alternating layers in the heterostructure stack. By etching the appropriate layers to achieve a "deck of playing cards" effect, with each alternate "card" moved in a different direction, fully conventional type selective metallizations are used to selectively contact the p- and n-type layers, as shown in FIG. 6. Again, fully conventional methods are used to contact the layers at the surface. The etching and metallization processes which are applicable to this aspect of the invention are disclosed, e.g., in Logan and Reinhart, J. Appl. Phys. 44 4172, 1973.

The foregoing methods are significantly different from that of G. H. Dohler, Appl. Phys. Lett. 49 704 (Sept. 22, 1986), where a modulated doped concentration was used to effect n- and p-layers. Thus, only a single material was involved in the contacting aspects, as opposed to this invention where adjoining layers are of different compositions. However, Dohler's method could be used to construct the present invention.

In a preferred application of this invention, the multilayer reflectance regions of this invention are incorporated in a Fabry-Perot device as a bistable optical device, surface emitting laser, or optical modulator, such as any of those disclosed in the references cited herein, to form the reflective surfaces.

Prior art fabrication of a bistable Fabry-Perot optical switch is lengthy and complicated as it involves at least four steps: (1) growth of the semiconductor active medium (typically by molecular beam epitaxy or chemical vapor deposition); (2) removing the active medium from the substrate on which it was grown; (3) separate growth of the high reflector mirrors by a separate vacuum evaporation technique; and sometimes (4) the process of cementing the mirrors to the active medium. If the high reflectors (HR's) are vacuum deposited directly onto the active layer, they may not adhere well. Steps (3) and (4) often involve handling a very delicate flake (about 3 microns thick) of the active medium which is subject to breakage. Also, this thin flake may not have a uniform thickness which degrades the resonance of the optical cavity. Another problem is that the cementing process leaves a thin film separating the active medium from the mirrors. This can result in detrimental optical interference effects and/or poor thermal contact of the mirrors to the active medium. Both of these can degrade the performance of the optical switch. Finally, conventional quarter wave HR's have optical characteristics which are subject to change with time and environment.

Figure 7:
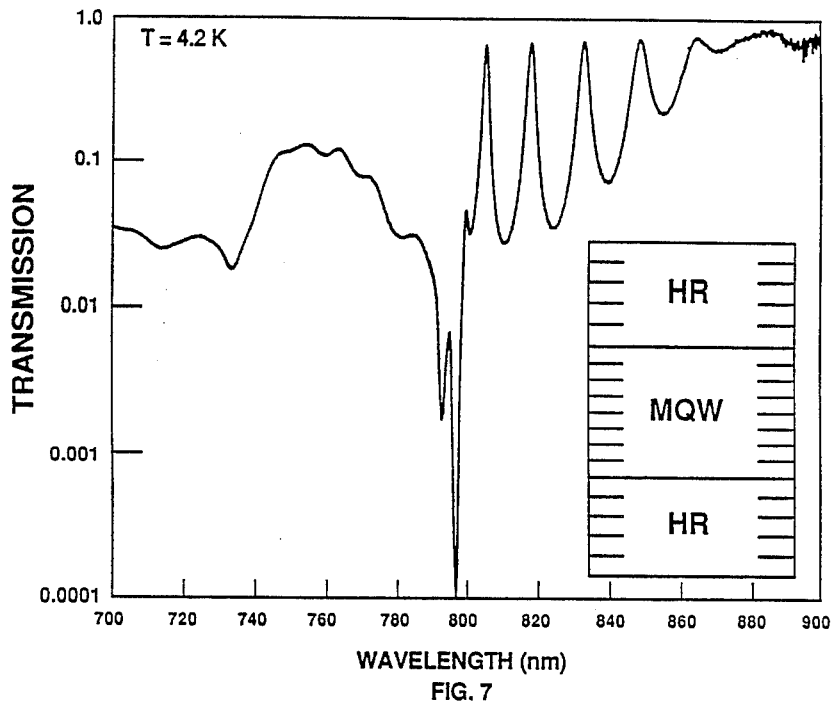
FIG. 7 shows the transmission spectrum of a Fabry-Perot cavity formed by the single crystal growth of a multiple quantum well (MQW) between two HRs.

FIG. 7 shows the transmittance spectrum of a Fabry-Perot resonator (inset) in accordance with this invention. The reflectors of the resonator are 10½ period HRs of alternating layers of AlAs (710 Angstroms) and $Al_{0.4}Ga_{0.6}As$ (630 Angstroms), the ternary layer with the higher refractive index bounding the HR on both sides. The Fabry-Perot spacer is a 150 period GaAs (100 Angstroms), $Al_{0.4}Ga_{0.6}As$ (200 Angstroms) multiple quantum well (MQW). The layer optical thicknesses in the HRs correspond to ¼ wavelength of the room-temperature exciton peak (8400 Angstroms) of the MQW.

The spectrum of the resonator in FIG. 7 shows a series of sharp transmittance resonances beyond 800 nm, corresponding to the wavelengths transmitted by the resonator. These peaks show a finesse of 13, a value high enough for use in the proposed devices. Additional information on this embodiment is contained in Gourley et al., Appl. Phys. Lett. 50 (18), 4 May 1987.

A bistable optical switch using this invention has manufacturing advantages over the prior art, as it eliminates steps (2), (3) and (4) above. Furthermore, the interfaces between the active medium and the mirrors are very high quality, as single crystal heterojunctions eliminate any detrimental optical or thermal effects associated with poor physical contact.

Since the HR region may comprise superlattice layers, a fundamentally different kind of bistable optical switch can be fabricated per this invention. The superlattice layers act as nonlinear optically active media. The HR itself is capable of having its index of refraction altered by optical power, producing either transmissive or reflective bistability.

In one aspect of this invention, an intrinsic bistable optical device relies on the nonlinear properties of the index of refraction in a Fabry-Perot cavity. A single slab of nonabsorbing material with thickness d will transmit light of wavelength according to $$T = \frac{1}{1 + F \sin^2[(2cd/\lambda)(n_o + n_2 I) + \Phi]} \quad (5)$$

where $\Phi$ is a phase angle and $$F = \frac{4R_o}{(1 - R_o)^2} \quad (6)$$

where $R_o$ is the fundamental surface reflectance. Under bistable conditions, at low intensities, the Fabry-Perot cavity is off the transmission resonance. As the input intensity is increased, the refractive index change of the spacer shifts the transmission resonance towards the laser frequency. This increases the transmitted light and cavity energy and results in a further change in the index and so on. This positive feedback results in the output intensity suddenly switching to a high value. Upon lowering the input intensity, a hysteretic effect is present.

The transmission is resonantly enhanced when the optical thickness is an integral multiple of half the wavelength. However, to observe this enhanced resonance the slab must have very parallel sides and be polished to approximately $\lambda/10$ or better. The resonance sharpness or finesse can be improved by coating the sides of the slab to enhance the surface reflectance. This is most effectively accomplished by depositing quarter wave high reflector stacks on both sides. These high reflector multilayers are conventionally deposited by vacuum evaporation of polycrystalline materials. However, in this invention, the HR's are integrated directly in a single growth process of both the HR's and the active layer, as shown in the inset of FIG. 7. These HRs give high reflectance at a selected wavelength as defined by equations (1)–(4). These stacks can take several forms depending on the indices of refraction of the cavity active medium (MQW), the HR layer media, and the medium surrounding the cavity. Usually the cavity medium has the highest index and the surrounding medium is air or substrate. For several reasons, a good form for the HR mirrors is HLHL ... L where the right side faces the cavity and H (L) represents a quarter wave thickness of the high (low) index material. Accordingly, the configuration of the cavity is air/HLHL ... HL/active medium/LHLH ... LH/air.

When the optical thickness of the active medium corresponds to an integral multiple of half the incident wavelength, the net reflections from the front and back mirrors are out of phase by 180° and the transmission is maximized. In terms of the transmission matrix theory, the active layer corresponds to an absentee layer with unit matrix and the front and rear mirror matrices are inversely related. The finesse of this cavity is given by $$f = \frac{\pi}{2} \times (F)^{\frac{1}{2}} \text{ where } F = \frac{4R}{(1 - R)^2} \quad (7)$$

for an integrated device with $n_m = 1$, $n_a = 3.6$, $n_H/n_L = 1.1$ and $N = 15$, $R = 0.93$, $F = 930$, and $f = 49$.

Thus this ideal integrated semiconductor Fabry-Perot resonator has a high finesse value at the design wavelength and forms a very high performance bistable optical device. The finesse of 13 for the resonator of FIG. 7 could be improved with more perfect interfaces and matched HRs. Many materials can used in the optical interference regions of this invention and in the otherwise conventional active regions. Thus, matched materials such as aluminum arsenide/gallium arsenide, germanium/gallium arsenide, silicon/gallium phosphide, gallium phosphide/aluminum phosphide, etc. can be employed and mismatched materials can also be employed, e.g., gallium arsenide/gallium phosphide, indium phosphide/gallium phosphide, aluminum phosphide/gallium phosphide, silicon/germanium, gallium arsenic phosphide/gallium phosphide, etc., including others listed in Gourley et al., SPIE, Vol 792, 1 Aug. 1987.

The thickness of the layers, the number of periods, the overall thickness of the stack, the dimensions of the monolithic device, etc., are all determined either in accordance with fully conventional considerations or with the considerations described herein. Typically, for light in the visible region, layer thicknesses in a quarter wave stack will be 400–1000 Angstroms, smaller and larger thicknesses, of course, being possible. In lattice mismatched structures, the amount of mismatch between layers, the compositions thereof, the amount of strain, etc., will all be fully conventionally determinable in accordance with the references cited above. Layers will be grown according to the fully conventional techniques of molecular beam epitaxy or chemical vapor deposition. MBE is preferably used; however, MOCVD will be desirable where the layers are relatively thick (e.g., microns), e.g., where IR wavelengths are involved, since deposition rates can be much faster (on the order of um/min vs. um/hr. for MBE).

For the devices of this invention which incorporate the electrically tuned optical interference stack, a preferred embodiment is the mentioned Fabry-Perot device. However, of course, this aspect of the invention is fully applicable to essentially any semiconductor device which involves a surface or a region which must reflect and/or transmit light to a certain degree. Such devices include photodetectors, lasers, other light-emitting devices, etc.

For such electrically tunable devices, doping concentrations typically will be, for example, in AlGaAs for n-type layers, about $10^{18}$–$10^{19}$/cm$^3$ and for GaAs or AlGaAs for lightly doped p-layers, about $10^{16}$/cm$^3$. Layer thicknesses are calculated in accordance with the foregoing considerations, e.g., for a standard quarter-wave stack at 8400 Angstroms, layer thicknesses are about 600–750 Angstroms depending on composition, e.g., about 630 Angstroms for GaAs and about 710 Angstroms for AlAs. Typical field strengths across the optical interference region in the electrically controlled devices will be on the order of $10^4$ V/cm.

Figure 8:
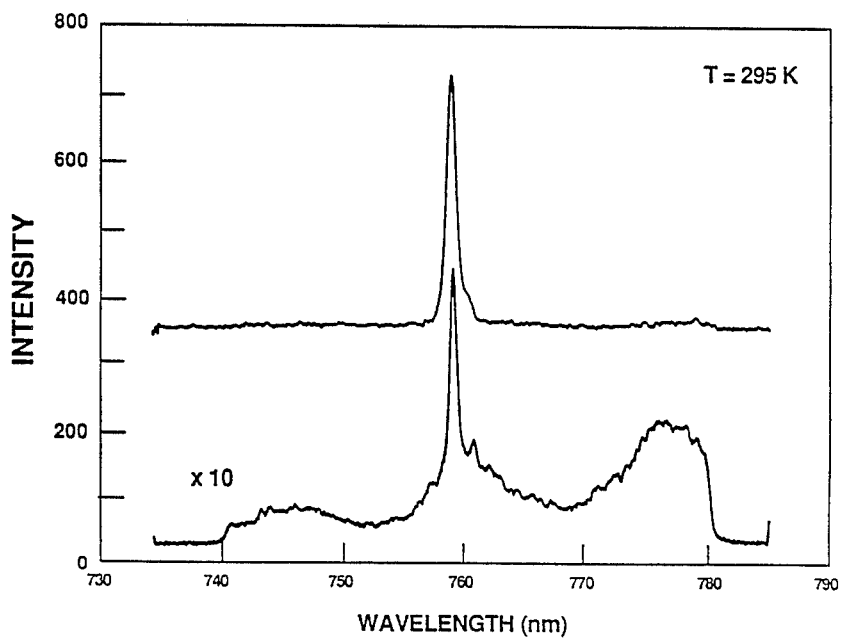
FIG. 8 shows a single-mode laser output of a Fabry-Perot resonator.

The Fabry-Perot resonator of FIG. 7 has also been examined as a laser. FIG. 8 shows the single-mode output of the resonator when excited by a 12 ns pulse of 6471 Angstrom light of $2 \times 10^6$ W/cm$^2$ peak power. The lower curve shows the onset of lasing at 7592 Angstroms near the center of the Fabry-Perot mode. After correcting for instrumental broadening, the linewidth is known to be only 4 Angstroms. The upper trace shows the same material at slightly higher power to have a corrected linewidth of 9 Angstroms.

When the resonator was cleaved into small (20×50 um²) rectangles, lasing could also be observed along the wafer plane. Compared to the vertical lasing discussed in FIG. 8, above, the threshold for lateral lasing action was very low, largely due to the longer cavity length and lateral waveguiding provided by the MQW. However, the structure does serve as a bilaser capable of lasing in two orthogonal directions, a feature that could be useful in laser switching applications in computers.

The vertical lasing of the resonator also provided an ability to control the lasing frequency, which has been found to be dependent on the thickness of the HR at the point where impinged by the pumping beam spot. By making an HR of varying thickness, the lasing wavelength may be tuned by moving the pump spot to different wafer regions.

In addition, the laser utilizing the resonator of this invention was found to exhibit much better temperature insensitivity than previous lasers. The amount of power required for the onset of lasing increases exponentially with temperature in conventional lateral waveguide semiconductor lasers. In the sample under test, onset power increased less than 3 times over a temperature range from 4 to 300 K. This weak dependence on temperature is believed due to three factors. First, the large difference in material properties between the mirrors and the lasing MQW medium. The temperature dependence of the refractive indices of the HR-to-spacer reflectance at the lasing wavelength is much less than that for conventional semiconductor lasers. In other words, the temperature insensitivity is increased because the mirror corresponds to a material with a very high effective index of refraction, while the MQW has a much lower value. In a cleaved laser, the index for the semiconductor material is not too different than the index for air, from which the beam is reflected.

Secondly, the use of HRs with reflectance near 100% causes the lasing threshold to become much less sensitive to the temperature dependent gain of the lasing medium, as discussed by Leopold et al., Appl. Phys. Lett. 50 20 18 May 1987, for cleaved lasers wherein the reflectance cannot be changed. The present invention allows the reflectance to be greatly increased over lateral structures to obtain temperature insensitivity. Thirdly, the MQW material has a lower temperature sensitivity than bulk semiconductors like GaAs.

Since temperature insensitivity is a major feature of the invention, the invention will be particularly applicable to situations where a semiconductor laser is to be operated at more than one temperature. Since the capability of temperature control via the appropriate incorporation of optical interference regions has heretofore not be appreciated, prior art devices such as those of Ogura et al and U.S. Pat. No. 4,309,670 have not taken advantage of this feature.

In the context of this invention, temperature insensitivity, of course, is a relative term. Typically, the frame of reference for defining this term will be the temperature dependence of the corresponding device where conventional reflecting/transmitting surfaces are included in place of the optical interference regions per this invention. Thus, a relatively temperature insensitive device will be one which has its properties change to a lesser degree with temperature than the properties of the conventional device and vice versa. For example, a device having an end mirror providing an interface with air (e.g. GaAs-air cleve) can be compared with a corresponding device of this invention wherein the end "mirror" is provided by the highly reflective optical interference region of this invention.

For the relatively temperature-insensitive devices of this invention, especially preferred applications would also be those wherein device heating might previously have caused a semiconductor laser to degrade such that output power decreased or the lasing threshold increased, perhaps to a value greater than the output of the device power supply.

The particular sizes and equipment discussed above are cited merely to illustrate particular embodiments of this invention. It is contemplated that the use of the invention may involve components having different sizes and shapes as long as the principles set forth herein are followed. It is intended that the scope of the invention be defined by the claims appended hereto.

We claim:

1. An electrically tunable semiconductor device comprising:

a monolithically incorporated multilayer optical interference region comprising a series of alternating n- and p-layers having indices of refraction which differ from each other;

a first electrical contact consisting of a metallization region in direct physical and electrically conductive contact with said n-layers, and not in physical or electrically conductive contact with said p-layers; and a second electrical contact consisting of a second metallization region in direct physical and electrically conductive contact with said p-layers, and not in physical or electrically conductive contact with said n-layers.

2. The tunable device of claim 1 wherein said first and second electrical contacts are ion implants physically contacting said n- and p-layers.

3. The tunable device of claim 1 wherein said n- and p-layers comprise adjacent semiconductor materials with matched lattice constants.

4. The tunable device of claim 1 further comprising a second optical interference region comprising a series of alternating n- and p-layers having indices of refraction which differ from each other; and a Fabry-Perot spacer having two opposed faces, one said face physically contacting one face of said first optical interference region, the other said face physically contacting one face of said second optical interference region;

wherein said device is a Fabry-Perot resonator.

5. The tunable device of claim 4 wherein said Fabry-Perot spacer comprises a plurality of thin, alternating layers of at least two materials; wherein said spacer defines a multiple quantum well.

6. An electrically tunable semiconductor device comprising:

a monolithically incorporated multilayer optical interference region comprising a series of alternating n- and p-layers having indices of refraction which differ from each other, said layers comprising adjacent semiconductor materials with unmatched lattice constants;

a first electrical contact in direct physical and electrically conductive contact with said n-layers, and not in electrically conductive contact with said p-layers; and a second electrical contact in direct physical and electrically conductive contact with said p-layers, and not in electrically conductive contact with said n-layers.

7. An optical device comprising a single crystal comprising:
   first and second spaced high reflectors, each reflector comprising a stack of alternating layers of a two materials having different indices of refraction, the thickness of each layer being a quarter-wave length of a desired wavelength; and
   a multiple quantum well spacer having two opposed faces, one of said faces being in direct physical contact and forming a single crystal heterojunction with one layer of said first high reflector, said other face being in direct physical contact and forming a single crystal heterojunction with one layer of said second high reflector;
   wherein said device is a Fabry-Perot resonator and the layer of each reflector in contact with said spacer consists of a material having a lower index of refraction than said other material of said reflector, and the layer of material defining the opposite surface of each reflector consists of said other material.

* * * * *